(12) United States Patent
Kanda et al.

(10) Patent No.: US 8,315,094 B2
(45) Date of Patent: Nov. 20, 2012

(54) SEMICONDUCTOR MEMORY DEVICE

(75) Inventors: Kazushige Kanda, Kanagawa-ken (JP); Toshiki Hisada, Kanagawa-ken (JP); Katsuaki Isobe, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 191 days.

(21) Appl. No.: 12/957,865

(22) Filed: Dec. 1, 2010

(65) Prior Publication Data
US 2011/0134695 A1 Jun. 9, 2011

(30) Foreign Application Priority Data
Dec. 4, 2009 (JP) .................................. 2009-276633

(51) Int. Cl.
*G11C 11/34* (2006.01)
*G11C 16/04* (2006.01)
(52) U.S. Cl. .......... 365/185.05; 365/185.17; 365/185.26
(58) Field of Classification Search ............. 365/185.05, 365/185.17, 186.26, 185.21
See application file for complete search history.

(56) References Cited

U.S. PATENT DOCUMENTS

| 7,400,534 | B2 * | 7/2008 | Maejima ................. 365/185.17 |
| 7,505,311 | B2 * | 3/2009 | Maejima et al. ......... 365/185.01 |
| 7,733,695 | B2 | 6/2010 | Kim et al. |
| 7,839,686 | B2 * | 11/2010 | Shibata ................... 365/185.17 |
| 2011/0013456 | A1 | 1/2011 | Isobe et al. |

FOREIGN PATENT DOCUMENTS

JP 2011-23661 2/2011

OTHER PUBLICATIONS

U.S. Appl. No. 12/817,697, filed Jun. 17, 2010, Katsuaki Isobe, et al.

* cited by examiner

*Primary Examiner* — Toan Le
(74) *Attorney, Agent, or Firm* — Oblon, Spivak, McClelland, Maier & Neustadt, L.L.P.

(57) ABSTRACT

Provided is a semiconductor memory device including: multiple bit lines arranged in parallel to one another; multiple sense-amplifier bit lines arranged away from end portions of the bit lines; a fourth sense-amplifier bit line formed with a wire of a first layer arranged below the bit lines; selection transistors with a pair of gate electrodes arranged in a direction normal to the first to sixth bit lines; a first wire arranged below the bit lines and the sense-amplifier bit lines, and having an end portion extending to below the third bit line and connected to the bit line; a third wire formed with a layer of the gate electrode used as a wire, the third wire including a first end portion positioned below the fourth sense-amplifier bit line and connected to the fourth sense-amplifier bit line, and a second end portion positioned below the second sense-amplifier bit line; and a fourth wire formed with a wire of the first layer and arranged between the third wire and the second sense-amplifier bit line to connect the third wire to the second sense-amplifier bit line.

15 Claims, 5 Drawing Sheets

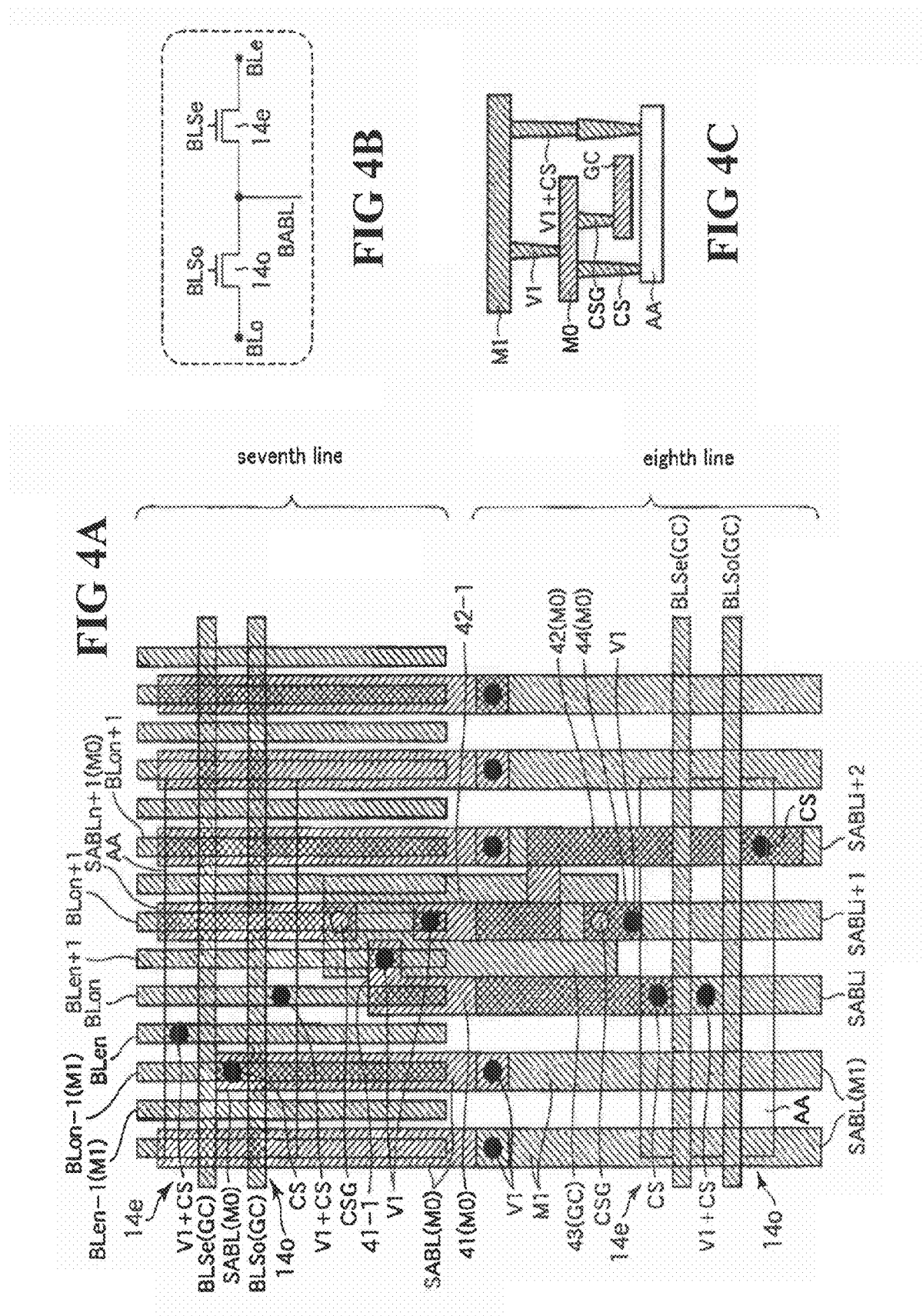

SEMICONDUCTOR MEMORY DEVICE

CROSS-REFERENCE TO RELATED APPLICATIONS

This application is based upon and claims the benefit of priority from the prior Japanese Patent Application No. 2009-276633, filed on Dec. 4, 2009, the entire contents of which are incorporated herein by reference.

U.S. patent application Ser. No. 12/817,697, filed on Jun. 17, 2010, describes semiconductor memory device. The entire contents of which are also incorporated herein by reference.

BACKGROUND OF THE INVENTION

1. Field of the Invention

Embodiments described herein relate generally to a NAND flash memory and to a semiconductor memory device capable of reducing the chip size.

2. Description of the Related Art

Bit-line patterns are important in NAND flash memories to miniaturize the elements. Bit-line patterns depend heavily on the sensing methods, and there are two methods: all bit line (ABL) sensing method (hereafter, referred to as the ABL method), in which sensing is performed on all the bit lines; and bit line shield (BLS) sensing method (hereafter, referred to as the BLS method), in which reading is performed with bit line shield. Besides these sensing methods, there are two methods of sense amplifier arrangement as cell architecture: two-sided sense-amplifier method, in which sense amplifiers are arranged at both sides of a cell array and bit lines are alternately connected to these sense amplifiers; and a single-sided sense-amplifier method, in which all the sense amplifiers are arranged at one of the two sides of a cell array, and bit lines are connected to these sense amplifiers.

Both the single-sided and two-sided sense amplifiers can be employed in the ABL method. It is, however, difficult to implement the single-sided sense amplifiers due to the greater difficulty in the routing of the wiring than in the two-sided sense-amplifier case, so that the two-sided sense-amplifier method is employed together with the ABL method. The two-sided sense-amplifier method has an advantage of easier layout because the method can halve the number of wires drawn from the bit lines. Miniaturization of elements, however, increases the capacitive coupling between bit lines, and an attempt to reduce the influence thereof results in lower performance. Accordingly, the ABL method is now losing its greatest advantage of producing higher performance. Consequently, the BLS method has been re-appreciated because the BLS method allows easier implementation of the single-sided sense amplifiers than the ABL method.

The ABL method combined with the two-sided sense amplifiers needs to draw only half the number of the bit lines to each side of the cell array, but the BLS method combined with the single-sided sense amplifiers needs to draw all the bit lines to one side of the cell array. Accordingly, the BLS method combined with the single-sided sense amplifiers has a configuration in which sense amplifiers of half the number of the bit lines are provided, a selection transistor is provided to select one of every pair of bit lines, and a connection transistor is provided to connect the selected bit line to the corresponding sense amplifier. A high voltage is applied to the bit lines while data are being erased. For this reason, the selection transistors and the connection transistors have to withstand a voltage high enough not to break down due to the erasing voltage. The use of high-voltage transistors, however, increases the chip area. Accordingly, various techniques to prevent the increase in the chip area have been developed.

Meanwhile, NAND flash memories employing the single-sided sense-amplifier method is subjected to the following constraints: a low cost constraint, a technical constraint in the lithography, and a spatial constraint in the selection-transistor arrangement.

Cutting the cost requires no increase in the number of wiring layers. Accordingly, even a NAND flash memory with miniaturized elements must be built with three metal wiring layers M0, M1, and M2 (hereafter, simply referred to as M0, M1, and M2) as in the conventional cases. To cut the cost, the uppermost layer, that is, M2 is patterned by use of a low-standard exposure apparatus, and thus cannot have a fine line-and-space pattern formed therein. Accordingly, M2 is not used for the fine bit-lines. The layout pattern of the bit lines is built in the two layers below M2, that is, M0 and M1. This is the low cost constraint.

In addition, when the memory cells are built, the sidewall patterning technique is used to form only three layer that are a layer where diffusion layers are patterned, a layer where word lines are patterned, and a layer where bit lines are patterned, because the sidewall patterning technique can handle the miniaturized patterns beyond the limit that the photolithography technique can handle. In the sidewall patterning technique, a core material is firstly patterned on the basis of the mask data, and then another patterning is carried out by using a sidewall material formed on the core material as a mask material. Accordingly, the sidewall patterning technique involves such high cost processing that M0 has to be formed by the photolithography. In other words, M0, which is the lowermost layer, have to be patterned at a pitch of 35 to 40 nm or even larger at which the photolithograph technique can form the pattern.

Supposing that the width of wiring (i.e., 2×half pitches (HP)) that the photolithography technique is capable of forming is 40 nm, M1 located between M0 and M2 needs a pattern of two parallel bit lines at a pitch of 20 nm (=HP) to be formed by use of an exposure apparatus capable of performing photolithography and the sidewall processing technique. In addition, a light-exposure process to cut the core material at end portions of the pattern is needed in the sidewall processing. It is, however, very difficult to form a random pattern with sets of two lines by fine processing through light exposure. Accordingly, the wiring of M1 cannot be cut halfway within each line. This means that bit lines of M1 traverse over the selection transistors.

In addition, the wiring of M0 has to be patterned at a pitch of 35 to 40 nm, which is close to the technical limit of the photolithography technique. Hence forming random patterns is technically difficult, and regular patterns, that is, patterns less susceptible to the optical proximity effect are preferred.

There is a limit to reduce the channel length of each selection transistor, and each selection transistor is so large that only a single selection transistor can be provided in a space covering several pitches of bit lines. That is, each selection transistor is larger than half the pitch patternable by the exposure apparatus through light exposure. Accordingly, it is difficult to arrange the selection transistors in a single line extending in a direction normal to an extending direction of the bit lines, so that the selection transistors have to be arranged in plural lines which are arranged along the extending direction of the bit lines.

As has been described, bit-line patterns have to be built to satisfy the constraint conditions for cost reduction, the technical limit of the lithography technique, and the arrangement of selection transistors.

BRIEF SUMMARY OF THE INVENTION

According to a first aspect of the invention, there is provided a semiconductor memory device comprising:

first to sixth bit lines formed with metal wires of a second layer and arranged at a first pitch in parallel to one another, end portions of the first to sixth bit lines being aligned neatly along a line;

first to third sense-amplifier bit lines formed with metal wires of the second layer and arranged at a second pitch that is twice larger than the first pitch at positions away respectively from the end portions of the second, the fourth, and the sixth bit lines in a bit-line direction;

a fourth sense-amplifier bit line formed with a metal wire of a first layer arranged below the fourth bit line, an end portion of the fourth sense-amplifier bit line receding from the end portion of the fourth bit line;

selection transistors with a pair of gate electrodes arranged in a direction normal to the first to sixth bit lines;

a first wire arranged below the second bit line and the first sense-amplifier bit line, the first wire including a first end portion in which a first extension portion extends to a space below the third bit line and is connected to the third bit line;

a third wire formed by use of a layer of the gate electrodes as a wire, the third wire including a first end portion positioned below the fourth sense-amplifier bit line and connected to the fourth sense-amplifier bit line, and a second end portion positioned below the second sense-amplifier bit line; and a fourth wire formed with a metal wire of the first layer and arranged between the third wire and the second sense-amplifier bit line so as to connect the third wire to the second sense-amplifier bit line.

BRIEF DESCRIPTION OF THE SEVERAL VIEWS OF THE DRAWING

FIG. 4A is a plan view illustrating the wiring pattern according to an embodiment of the invention. FIG. 4B is a circuit diagram corresponding to FIG. 4A. FIG. 4C is a schematic sectional view illustrating the relationship between the wiring and the contacts shown in FIG. 4A.

FIG. 4A is cut to form a sectional view.

DETAILED DESCRIPTION OF THE INVENTION

Figure 1:
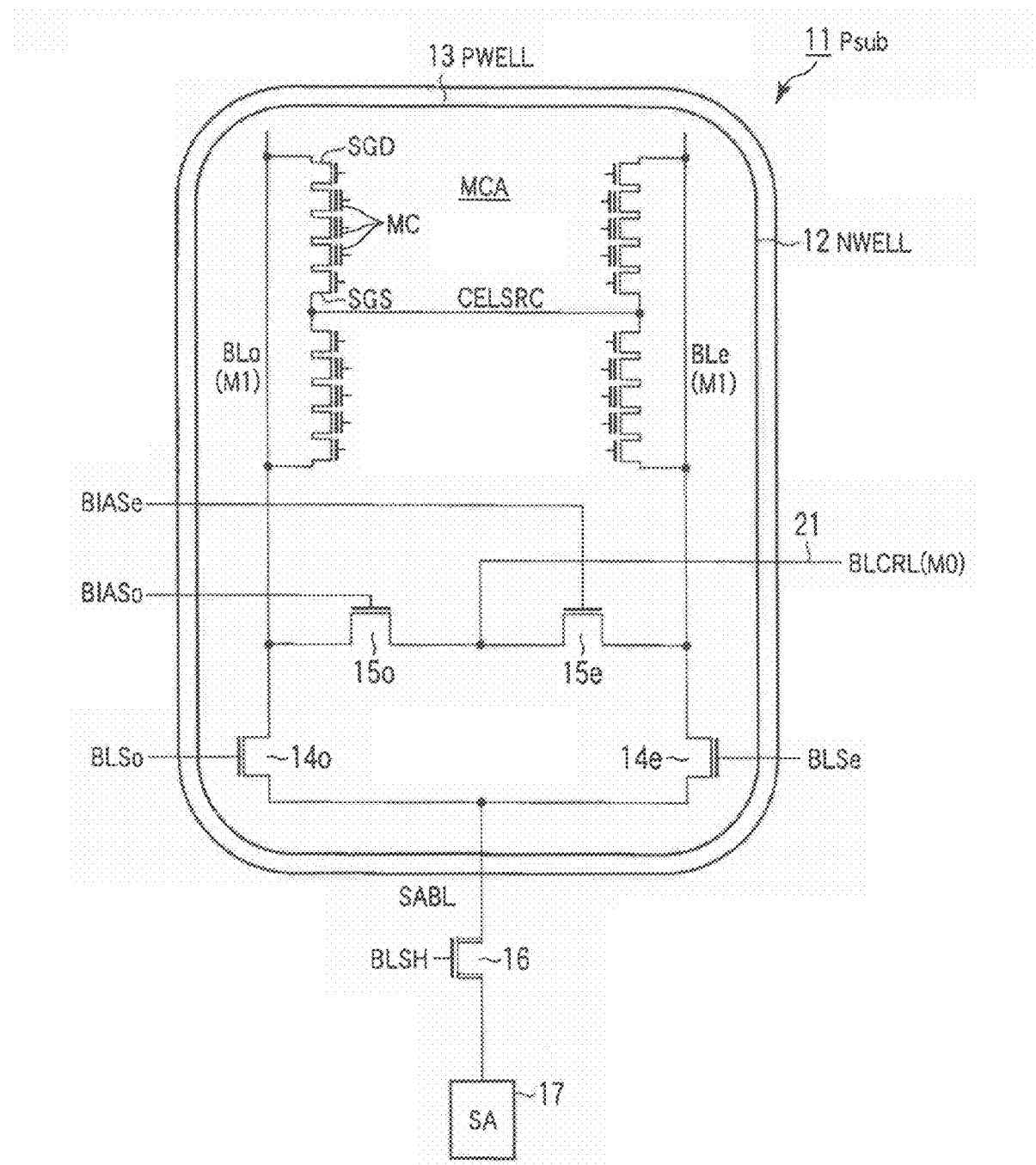
FIG. 1 is a circuit diagram illustrating a semiconductor memory device to which an embodiment of the invention is applied.

An embodiment of the invention is described by referring to the drawings.

Firstly, the pitch of the wiring formed in M0 is calculated, provided that the above-described constraint conditions for cost reduction, the technical limit of the lithography technique, and the arrangement of selection transistors are satisfied. In the following description, the pitch of the wiring of M1 (i.e., HP) is a nm; the pitch of the selection transistors is r nm; and the number of wires of M1 which can be arranged within this pitch is k. In addition, a space corresponding to a single wire of M0 is secured as the contact area to connect each wire of M1 and the diffusion layer of the corresponding selection transistor. Then, the number of wires of M0 is expressed by the following formula:

$$k/2+1=r/(4\times a)+1$$

Accordingly, the wiring pitch in M0 (which is expressed as b nm) is expressed by the following formula:

$$b=r/\text{number of wires of } M0=(4\times a\times r)/(r+4\times a)$$

Since $r=2\times a\times k$, the wiring pitch b in M0 is calculated by transforming the above formula.

$$b=4\times a\times k/(2\times k+4)$$

What follows are the results obtained by substituting corresponding values of each generation for the wiring pitch a in M1 and the number k of the wires of M1 arranged in the pitch.

a nm:k:b nm
70:5:100
60:6:90
50:7:78
40:8:64
30:11:51
25:13:44
20:16:36
18:17:33
16:19:29

Accordingly, the patterning by the photolithography technique is possible for the semiconductor memory devices of the 25-nm generation or earlier, but is not possible for the ones later than the 20-nm generation. Hence, the connection between the bit lines and the corresponding selection transistors cannot be secured by the wiring of M0 alone.

Embodiments

Figure 2:
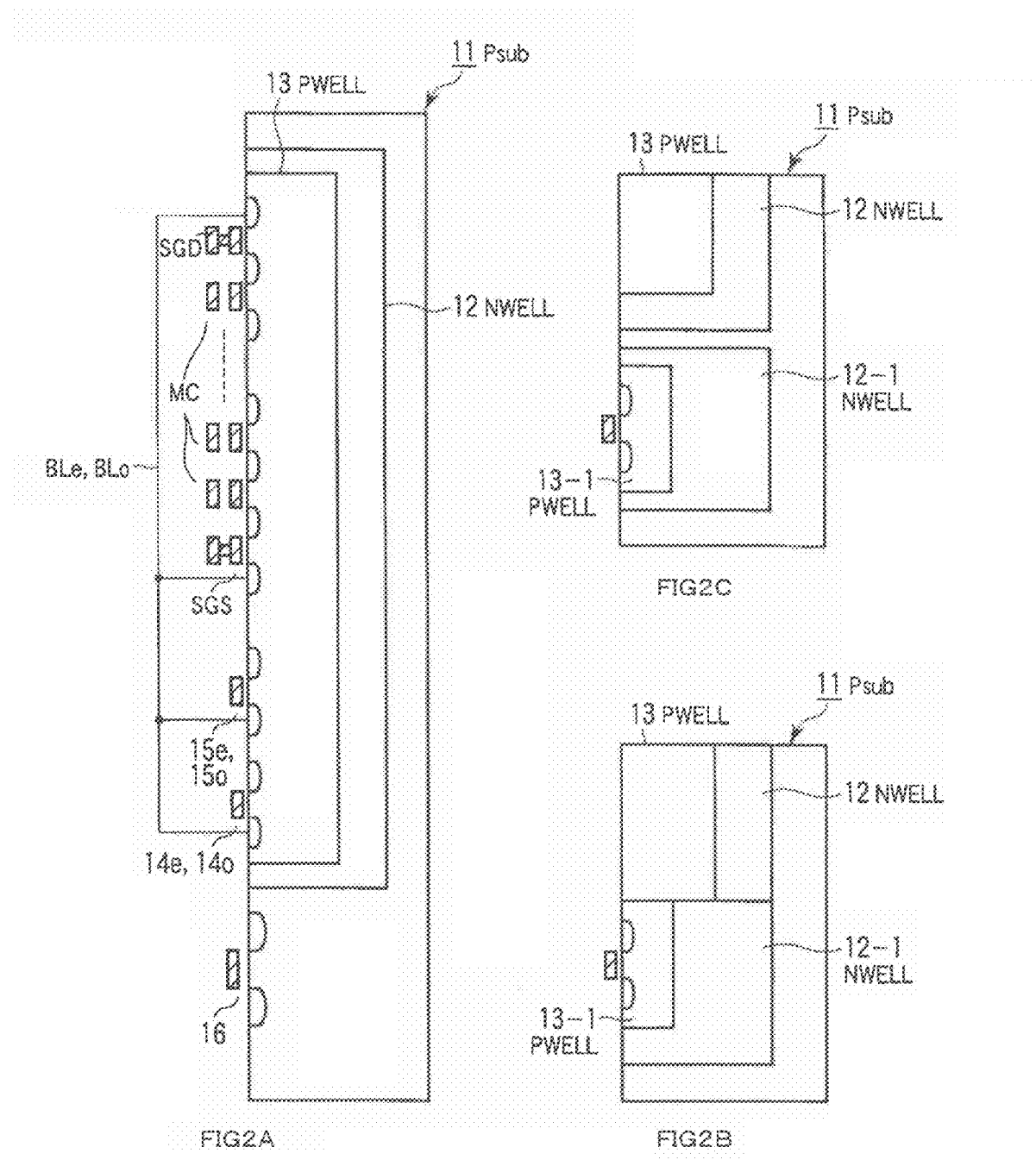
FIG. 2A is a sectional view illustrating a portion of FIG. 1.
FIGS. 2B and 2C are sectional views respectively illustrating modified examples of wells.

FIG. 1 illustrates a semiconductor memory device to which the invention is applied. For the sake of simple description, FIG. 1 shows the configuration associated only with a pair of bit lines BLe and BLo. FIG. 2 shows sectional views of a portion of FIG. 1. Those portions that appear both in FIGS. 1 and 2 are denoted by the same reference numerals in these drawings.

FIGS. 1 and 2A show that an n type well region (NWELL) 12 is formed in a p type substrate (Psub) 11. A p type well region (PWELL) 13 for a memory cell is formed in the NWELL 12. Arranged in the PWELL 13 are a memory-cell array MCA, bit lines BLe and BLo, first bit-line selection transistors 14e and 14o to select one of the bit lines BLe and BLo, and second bit-line selection transistors 15e and 15o serving as the selection transistors for the shield. The memory-cell array MCA includes plural NAND strings. Each NAND string includes plural memory cells MC, and selection transistors SGD and SGS. The selection transistor SGS of each NAND string is connected, for example, to a cell-source line CELSRC, whereas the selection transistor SGD of each NAND string is connected to either one of the bit lines BLe and BLo.

Each of the first and the second bit-line selection transistors 14e, 14o, 15e, and 15o has a configuration that is almost identical to each memory cell. Each of the first and the second bit-line selection transistors 14e, 14o, 15e, and 15o has a configuration in which the floating gate electrode and the control gate electrode of each memory cell are electrically connected to each other.

One of the source and the drain of the first bit-line selection transistor 14e is connected to the bit line BLe, whereas one of the source and the drain of the first bit-line selection transistor 14o is connected to the bit line BLo. The other one of the source and the drain of each of the first bit-line selection transistors 14e and 14o is connected to a sense amplifier 17 through a sense-amplifier bit line SABL and a transistor 16. A signal BLSH is supplied to the gate electrode of the transistor 16.

One of the source and the drain of the second bit-line selection transistor 15e is connected to the bit line BLe, whereas one of the source and the drain of the second bit-line selection transistor 15o is connected to the bit line BLo. The other one of the source and the drain of each of the second bit-line selection transistors 15e and 15o, that is, the cell source is connected to a metal wire 21, which is connected to an unillustrated voltage generator circuit to generate a shield voltage BLCRL.

Signals BLSo, BLSe, BIASo, and BIASe are supplied respectively to the gate electrodes of the first and the second bit-line selection transistors 14o, 14e, 15o, and 15e.

The first and the second bit-line selection transistors 14e, 14o, 15e, and 15o are formed, for example, in the PWELL 13. Hence, these transistors are low-voltage transistors.

Meanwhile, the transistor 16 is formed, for example, in the substrate 11, so that the transistor 16 is a high-voltage transistor whose breakdown voltage is higher than that of the first and the second bit-line selection transistors 14e, 14o, 15e, and 15o.

The first and the second bit-line selection transistors 14e, 14o, 15e, and 15o of the above-described example is formed in the same well region in which the memory cells are formed, but this is not the only possible case. FIGS. 2B and 2C show cases where selection transistors are formed in a well region that is different from the one in which memory cells are formed.

In the configuration shown in FIG. 2B, the impurity concentrations of well regions where selection transistors are formed—a p type well region 13-1 and an n type well region 12-1—are different respectively from the impurity concentrations of the corresponding well regions where memory cells are formed—the p type well region 13 and the n type well region 12. For example, the dose of the impurities in the p type well region 13-1 and that in the n type well region 12-1 are reduced respectively from the dose in the p type well region 13 and that in the n type well region 12. The above-described relationship between these impurity concentrations, however, is not the only possible example.

In the configuration shown in FIG. 2B, the cell regions where memory cells are formed—the p type well region 13 and the n type well region 12—are in contact with the well regions where selection transistors are formed—the p type well region 13-1 and the n type well region 12-1.

In contrast, in the configuration shown in FIG. 2C, the cell regions where memory cells are formed—the p type well region 13 and the n type well region 12—are isolated from the well regions where selection transistors are formed—the p type well region 13-1 and the n type well region 12-1.

Figure 3:
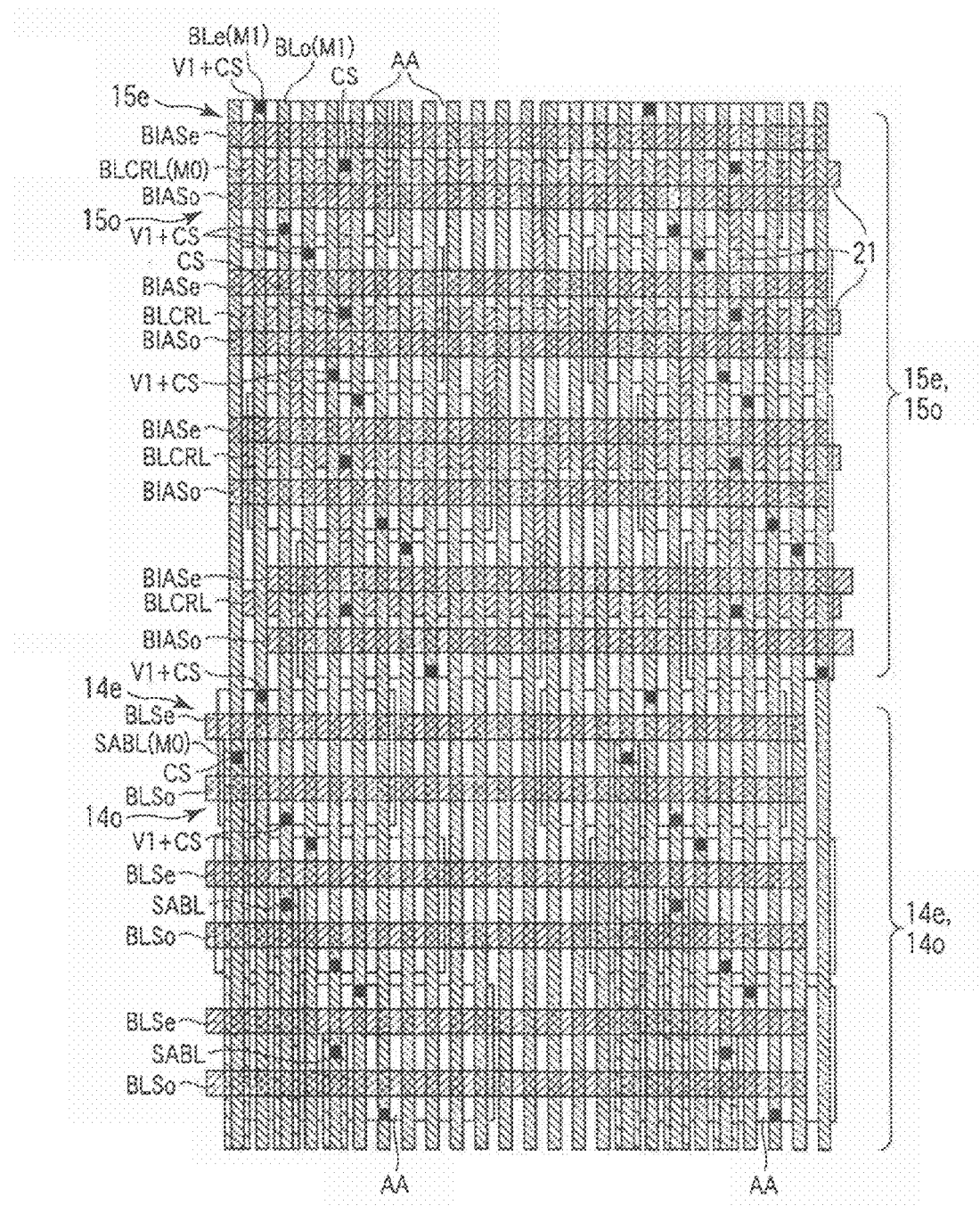
FIG. 3 is a plan view illustrating the wiring pattern of a part of FIG. 1.

FIG. 3 shows the patterns of the first and the second selection transistors 14e, 14o, 15e, and 15o, and the bit lines BLe and BLo in the circuit shown in FIGS. 1 and 2. It is assumed that eight lines of each of the first and the second bit-line selection transistors 14e, 14o, 15e, and 15o are arranged in the bit-line direction. FIG. 3 shows four of the eight lines of each of the second bit-line selection transistors 15e and 15o, and three of the eight lines of each of the first bit-line selection transistors 14e and 14o.

The plural bit lines BLe and BLo shown in FIG. 3 are the wires in M1. Below the bit lines BLe and BLo, plural second bit-line selection transistors 15e and 15o are arranged both in the bit-line direction and in a direction normal to the bit lines.

In addition, below the plural bit lines BLe and BLo, plural first bit-line selection transistors 14e and 14o are arranged both in the bit-line direction and in a direction normal to the bit lines. The gate electrodes of the second bit-line selection transistors 15e and 15o to which the signals BIASe and BIASo are supplied are arranged in a direction normal to the plural bit lines BLe and BLo. In addition, the gate electrodes of the first bit-line selection transistors 14e and 14o to which the signals BLSe and BLSo are supplied are also arranged in a direction normal to the plural bit lines BLe and BLo.

In FIG. 3, the regions denoted by AA are diffusion layers serving as the source or the drain regions of the first and the second bit-line selection transistors 14e, 14o, 15e, and 15o. Every pair of bit lines BLe and BLo is connected to the corresponding one of the diffusion layers AA by means of consecutive contacts including a contact V1 and a contact CS (hereafter, the consecutive contacts is referred to as the contacts V1+CS).

The diffusion layers located between the second bit-line selection transistors 15e and 15o are connected, by the contacts CS, to the corresponding wire 21 to which the voltage BLCRL is supplied. The wire 21 is formed, for example, with M0 located below M1. Each wire 21 is connected commonly to plural second bit-line selection transistors 15e and 15o.

In addition, in the first bit-line selection transistors 14e and 14o, the diffusion layers AA serving as the source or the drain regions are connected to the corresponding bit lines BLe and BLo by means of the contacts V1+CS. The diffusion layers located between the first bit-line selection transistors 14e and 14o are connected to the corresponding sense-amplifier bit lines SABL by means of the contacts CS. The sense-amplifier bit lines SABL are formed with M0, and are arranged in the bit-line direction below the bit lines BLo, for example. In addition, the sense-amplifier bit lines SABL are formed at a pitch twice larger than that of the bit lines BLe and BLo.

Of the eight lines of each of the first bit-line selection transistors 14e and 14o, the seventh and the eighth ones located near the sense amplifiers are shown in FIG. 4A. Of the portions that appear in FIGS. 4A, 4B, and 4C, those that appear also in FIG. 3 are denoted by the same reference numerals that are used in FIG. 3.

As FIG. 4A shows, the ends of the plural bit lines BLe and BLo are aligned neatly along a line between the first bit-line selection transistors 14e and 14o of the seventh line and those of the eighth line, so that no bit lines BLe and BLo are formed above the first bit-line selection transistors 14e and 14o of the eighth line.

The second bit-line selection transistors 15e and 15o serving as selection transistors for the shield can be implemented in an ordinary layout because all that is necessary is to connect the common nodes of these transistors to the corresponding wires 21 to which the voltage BLCRL is supplied. In contrast, the first bit-line selection transistors 14e and 14o must satisfy the above-described constraint conditions.

FIG. 4B shows the relationship that the first bit-line selection transistors 14e and 14o have with the wires. FIG. 4C shows the relationship between each wire and the contacts. FIG. 4C is associated with FIG. 4A in the following way. A portion AA represents a diffusion layer serving as a transistor region; a portion GC represents a gate-electrode wire for transistors; a portion M0 represents a first metal wire layer; a portion M1 represents a second metal wire layer, a portion CS represents a contact between AA and M0; a portion CSG represents a contact between GC and M0; a portion V1 represents a contact between M0 and M1; and a portion V1+CS represents consecutive contacts including V1 and CS.

To make the first bit-line selection transistors 14e and 14o of the seventh line satisfy the constraint conditions, the contacts V1+CS to connect the bit lines BLen and BLon as the wires of M1 to the diffusion layers AA of the first bit-line selection transistors 14e and 14o are arranged successively in pairs along the gate-electrode wire GC as shown in FIGS. 3 and 4A. The common node of the first bit-line selection transistors 14e and 14o is connected, by means of the contact CS, to the corresponding sense-amplifier bit line SABL as the wire of M0. The positions of the contact CS is below the bit line BLon−1, which is adjacent to the bit line BLen. Of the eight lines of the first bit-line selection transistors 14e and 14o, those of the first to the seventh lines are arranged in the above-described layout.

The bit lines BLen+1 and BLon+1 are not arranged above the first bit-line selection transistors 14e and 14o of the eighth line, but plural sense-amplifier bit lines SABL as the wires of M1 are arranged instead. These sense-amplifier bit lines SABL are wires of M1, and are arranged at a pitch twice larger than that of the bit lines. The sense-amplifier bit lines SABL are arranged corresponding respectively to the odd-numbered bit lines. Specifically, SABLi corresponds to BLon, SABLi+1 corresponds to BLon+1, and SABLi+2 corresponds to BLon+2.

To connect the bit lines BLen+1 and BLon+1 to the first bit-line selection transistors 14e and 14o of the eighth line, wires 41 to 44 are provided between the seventh and the eighth lines. Wires 41, 42, and 44 are wires of M0, whereas the wire 43 uses the gate electrodes as the wiring.=

The wire 41 is arranged mainly below the sense-amplifier bit line SABLi, for example, and includes an extension portion 41-1 located in a first end portion thereof and extending below the bit line BLen+1. In this extension portion 41-1, the wire 41 is connected to the bit line BLen+1 by means of the corresponding contact V1. A second end portion of the wire 41 is positioned above the diffusion layer AA of the first bit-line selection transistor 14e of the eighth line. This second end portion and the diffusion layer AA is connected to each other by means of the corresponding contact CS. In addition, the common node of the first bit-line selection transistors 14e and 14o is connected to the diffusion layer AA by means of the corresponding contacts V1+CS. The contacts V1+CS are positioned between a pair of gate electrodes.

The wire 42 is arranged mainly below the sense-amplifier bit line SABLi+2, for example, and includes an extension portion 42-1 located in a first end portion thereof and extending below the bit line BLon+1. In this extension portion 42-1, the wire 42 is connected both to the bit line BLon+1 by means of the corresponding contact V1. A second end portion of the wire 42 is positioned above the diffusion layer AA of the first bit-line selection transistor 14o of the eighth line. This second end portion and the diffusion layer AA is connected to each other by means of the corresponding contact CS.

In addition, the wire 43 is formed, for example, so as to extend from an area below the bit lines BLen+1 and BLon+1 to an area below the sense-amplifier bit line SABLi+1. The wire 44 is arranged below the sense-amplifier bit line SABLi+1 and above the wire 43. The sense-amplifier bit line SABLn+1 formed below the bit line BLon+1 is connected to a first end portion of the wire 43 by means of the corresponding contact CSG. A second end portion of the wire 43 is connected to a first end portion of the wire 44 by means of the corresponding contact CSG. A second end portion of the wire 44 is connected to the sense-amplifier bit line SABLi+1 by means of the corresponding contact V1.

In summary, the layout described above can be divided into the following three regions.

A first region is a region connecting the first bit-line selection transistors 14e and 14o of the first to the seventh lines both to the corresponding bit lines BLe and BLo, and to the corresponding diffusion layers AA.

To put it differently, the first region is a region where, for example, a pair of bit lines BLen and BLon are connected both to the corresponding diffusion layer AA and to the common nodes of the corresponding first bit-line selection transistors 14e, 14o by means of the corresponding contacts V1+CS.

A second region is a region used for the withdrawal of the sense-amplifier bit line SABLn+1 (M0) of the first line and for the connection of the sense-amplifier bit line SABLi+1 (M1) of the eighth line.

To put it differently, the second region is a region where, for the purpose of drawing the sense-amplifier bit line SABLi+1 (M1) of the eighth line of a certain set, the sense-amplifier bit line SABLn+1 (M0) of the first one of the eight lines of the subsequent set is withdrawn to the wire 43 (GC). In the wiring area of M0 thus evacuated, the extension portion 42-1 of the wire 42 is provided, and the bit line BLon+1 and the diffusion layer AA of the first bit-line selection transistor 14o of the eighth line are connected to each other by means of the wire 42. In the second region, all bit lines are cut with their respective ends aligned neatly along a line. In addition, in the second region, the sense-amplifier bit lines SABL of M0 and the sense-amplifier bit lines of M1 are connected to each other by means of the contacts V1.

A third region is a region for the first bit-line selection transistors of the eighth line.

To put it differently, the third region is a region where the two wires 41 and 42 of M0 formed in the second region are connected to the diffusion layer AA of the first bit-line selection transistors 14e and 14o of the eighth line.

According to the embodiment described above, the bit lines BLe and BLo as well as the sense-amplifier bit lines SABL can be formed only with the layers M0 and M1. In addition, the sense-amplifier bit lines SABL of M0 are arranged at a pitch twice larger than the pitch of the bit lines BLe and BLo of M1. Hence the existing exposure apparatuses can be used to process M0, and thus the cost can be reduced.

In addition, the bit lines BLe and BLo of M1 are formed, by the sidewall processing technique, at half the minimum pitch that the existing exposure apparatuses can achieve. In addition, the bit lines BLe and BLo of M1 are formed in a line-and-space pattern with their respective end portions aligned neatly along a line. Accordingly, the influence of the optical proximity effect can be reduced, and thus the pattern can be formed with precision. In addition, the wires of M0 such as the sense-amplifier bit lines SABL can be formed almost in a line-and-space pattern. Accordingly, the influence of the optical proximity effect can be reduced, and thus the pattern can be formed with precision.

Suppose a case where only a single one of the first and the second bit-line selection transistors 14e, 14o, 15e, and 15o can be provided for every several pitches of the bit lines and where the first and the second bit-line selection transistors 14e, 14o, 15e, and 15o have to be formed in plural lines. In this case, the use of the wires 41, 42, 43, and 44 are used for the purpose of connecting the first bit-line selection transistors 14e and 14o of the eighth line to the bit lines BLen+1 and BLon+1 and of connecting the sense-amplifier bit lines SABL of M0 to the sense-amplifier bit lines SABL of M1. Accordingly, secure connections of these portions can be provided.

Hence, the bit-line pattern layout to be provided according to the embodiment is capable of achieving a low cost and reducing the influence of the optical proximity effect while satisfying the constraint conditions for cost reduction, the technical limit of the lithography technique, and the arrangement of selection transistors.

In the embodiment, the pitch of the transistors is equivalent to ten bit lines, for example, but this is not the only possible case. Alternatively, pitches of the transistors may be equivalent to eight, sixteen, thirty-two, forty-eight, or sixty-four bit lines, for example. In general, the pitch of the transistors may be equivalent to eight or larger even-numbered bit lines.

Figure 5A:
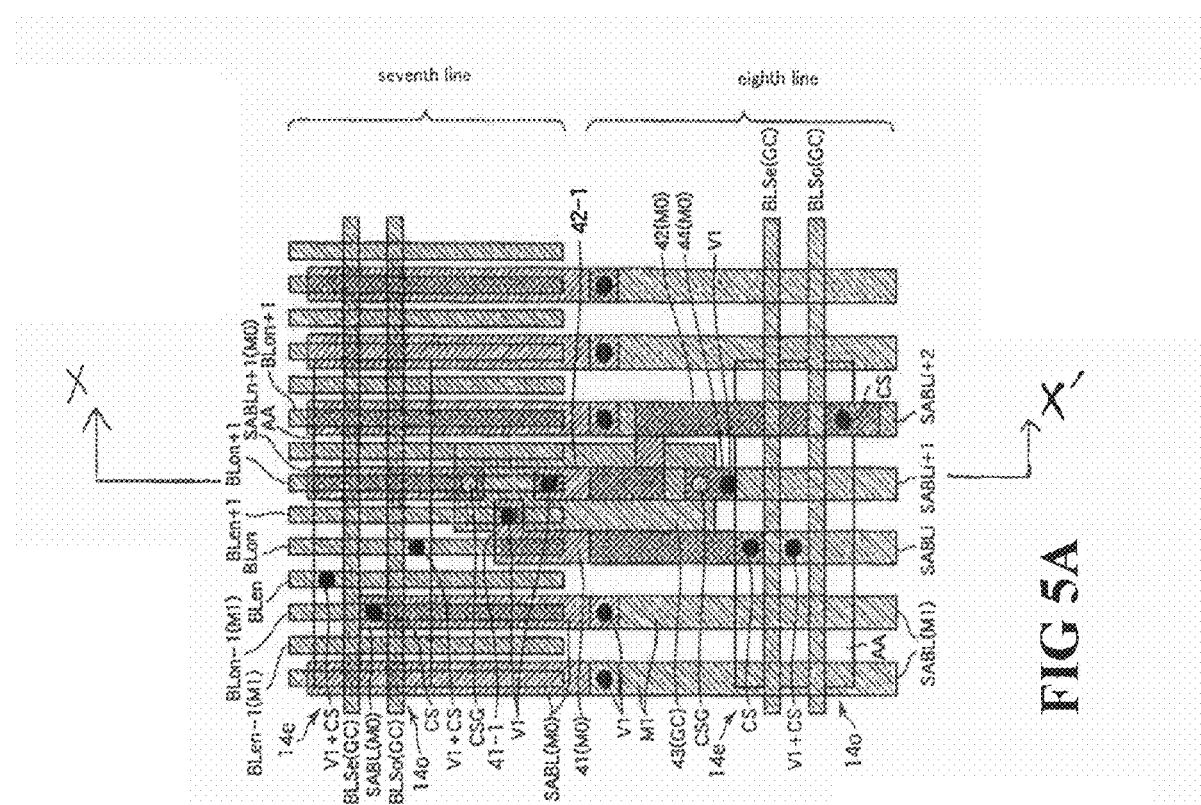
FIG. 5A is a diagram illustrating the position where
Figure 5B:
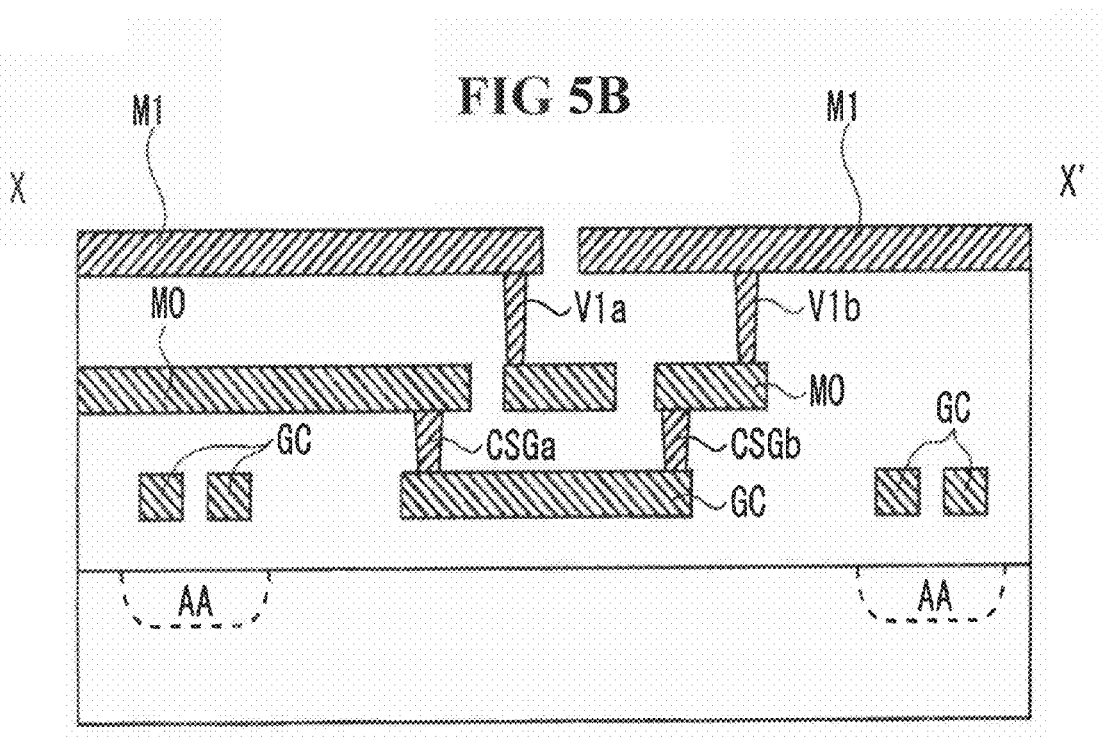
FIG. 5B is a sectional view taken along the line X-X of FIG. 5A.

Now, description is given, by referring to FIG. 5B, of the structure of a sectional portion taken along the line X-X' of FIG. 5A, which is a substantial reproduction of FIG. 4A. A wire of M1 is used for the bit line BLon+1 located on the X side of FIG. 5B. A wire of M0 below the wire of M1 is used for SABLn+1. Below M0, BLse and BLso formed with GC are arranged in a direction normal to the wires of the layers M0 and M1 located above. AA are formed in the silicone substrate below BLse and BLso. SABLn+1 formed with the wire of M0 is connected to the GC layer by means of CSGa at a position away from BLse and BLso formed with GC. At the very position, the layer M0 portion of SABLn+1 is terminated. SABLn+1 connected to the GC layer is re-connected to M0 at a position on the X' side by means of CSGb, and is further connected to M1 by means of V1b. In addition, on the X' side, BLse and BLso formed with GC are arranged in a direction normal to the wires of M1 located above. In addition, a space is left in the layer M0 because SABLn+1 formed with a wire of M0 is connected to the GC layer by means of CSGa and the layer M0 portion of SABLn+1 is terminated. That space of the layer M0 is connected to the bit line BLon+1 formed with a wire of M1 by means of V1a at a position a little away in the X' direction. This wire of M1 is terminated at a position a little close to the X' side in FIG. 5B. FIG. 5A, however, shows clearly that this wire of M1 is bent and is thus drawn to the adjacent region.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   first to sixth bit lines formed with metal wires of a second layer and arranged at a first pitch in parallel to one another, end portions of the first to sixth bit lines being aligned neatly along a line;
   first to third sense-amplifier bit lines formed with metal wires of the second layer and arranged at a second pitch that is twice larger than the first pitch at positions away respectively from the end portions of the second, the fourth, and the sixth bit lines in a bit-line direction;
   a fourth sense-amplifier bit line formed with a metal wire of a first layer arranged below the fourth bit line, an end portion of the fourth sense-amplifier bit line receding from the end portion of the fourth bit line;
   first and second selection transistors with a pair of gate electrodes arranged in a direction normal to the first to sixth bit lines, a source region and a drain region located respectively on two sides of the pair of gate electrodes connected respectively to the first and second bit lines;
   third and fourth selection transistors with a pair of gate electrodes arranged in a direction normal to the first to third sense-amplifier bit lines, each of the third and the fourth selection transistors having a source region and a drain region located across the corresponding one of the pair of gate electrodes;
   a first wire formed with a metal wire of the first layer and arranged below the second bit line and the first sense-amplifier bit line, the first wire including a first end portion in which a first extension portion extends to a space below the third bit line and is connected to the third bit line, and a second end portion connected to one of the source and the drain regions of the third selection transistor;
   a second wire formed with a metal wire of the first layer and arranged below the third sense-amplifier bit line, the second wire including a first end portion in which a second extension portion is connected to the fourth bit line, and a second end portion connected to one of the source and drain regions of the fourth transistor;
   a third wire formed by use of a layer of the gate electrodes as a wire, the third wire including a first end portion positioned below the fourth sense-amplifier bit line and connected to the fourth sense-amplifier bit line, and a second end portion positioned below the second sense-amplifier bit line; and
   a fourth wire formed with a metal wire of the first layer and arranged between the third wire and the second sense-amplifier bit line so as to connect the third wire to the second sense-amplifier bit line.

2. The semiconductor memory device according to claim 1, wherein the first to fourth selection transistors are formed in a well region where memory cells are formed.

3. The semiconductor memory device according to claim 1, wherein the first to fourth selection transistors are formed in a well region different from a well region where memory cells are formed.

4. The semiconductor memory device according to claim 1, wherein the first to fourth selection transistors are formed in a well region whose impurity concentration is different from that in a well region where memory cells are formed.

5. The semiconductor memory device according to claim 3, wherein a well region where the first to fourth selection transistors are formed is isolated from a well region where the memory cells are formed.

6. The semiconductor memory device according to claim 4, wherein a well region where the first to the fourth selection transistors are formed is isolated from a well region where the memory cells are formed.

7. The semiconductor memory device according to claim 1, wherein diffusion layers of the first to fourth selection transistors are arranged corresponding to eight or larger even-numbered bit lines.

8. The semiconductor memory device according to claim 2, wherein diffusion layers of the first to fourth selection transistors are arranged corresponding to eight or larger even-numbered bit lines.

9. The semiconductor memory device according to claim 4, wherein diffusion layers of the first to fourth selection transistors are arranged corresponding to eight or larger even-numbered bit lines.

10. A semiconductor memory device comprising:
    first to sixth bit lines formed with metal wires of a second layer and arranged at a first pitch in parallel to one another, end portions of the first to sixth bit lines being aligned neatly along a line;
    first to third sense-amplifier bit lines formed with metal wires of the second layer and arranged at a second pitch that is twice larger than the first pitch at positions away respectively from the end portions of the second, the fourth, and the sixth bit lines in a bit-line direction;

a fourth sense-amplifier bit line formed with a metal wire of a first layer arranged below the fourth bit line, an end portion of the fourth sense-amplifier bit line receding from the end portion of the fourth bit line;

selection transistors with a pair of gate electrodes arranged in a direction normal to the first to sixth bit lines;

a first wire arranged below the second bit line and the first sense-amplifier bit line, the first wire including a first end portion in which a first extension portion extends to a space below the third bit line and is connected to the third bit line;

a third wire formed by use of a layer of the gate electrodes as a wire, the third wire including a first end portion positioned below the fourth sense-amplifier bit line and connected to the fourth sense-amplifier bit line, and a second end portion positioned below the second sense-amplifier bit line; and a fourth wire formed with a metal wire of the first layer and arranged between the third wire and the second sense-amplifier bit line so as to connect the third wire to the second sense-amplifier bit line.

11. The semiconductor memory device according to claim 10, wherein the selection transistors are formed in a well region where memory cells are formed.

12. The semiconductor memory device according to claim 10, wherein the selection transistors are formed in a well region different from a well region where memory cells are formed.

13. The semiconductor memory device according to claim 10, wherein the selection transistors are formed in a well region whose impurity concentration is different from that in a well region where memory cells are formed.

14. The semiconductor memory device according to claim 12, wherein a well region where the selection transistors are formed is isolated from a well region where the memory cells are formed.

15. The semiconductor memory device according to claim 13, wherein a well region where the selection transistors are formed is isolated from a well region where the memory cells are formed.

* * * * *